Feb. 14, 1961 R. L. RILEY 2,972,066

TRANSISTOR BLOCKING OSCILLATOR WITH MEANS
TO PREVENT SATURATION OF TRANSISTOR
Filed Dec. 1, 1959

RAY L. RILEY,
INVENTOR

BY Robert W. Hines
ATTORNEY

United States Patent Office 2,972,066

Patented Feb. 14, 1961

2,972,066

TRANSISTOR BLOCKING OSCILLATOR WITH MEANS TO PREVENT SATURATION OF TRANSISTOR

Ray L. Riley, Los Angeles, Calif., assignor to Hughes Aircraft Company, Culver City, Calif., a corporation of Delaware Filed Dec. 1, 1959, Ser. No. 856,419

4 Claims. (Cl. 307—88.5)

Figure 1:
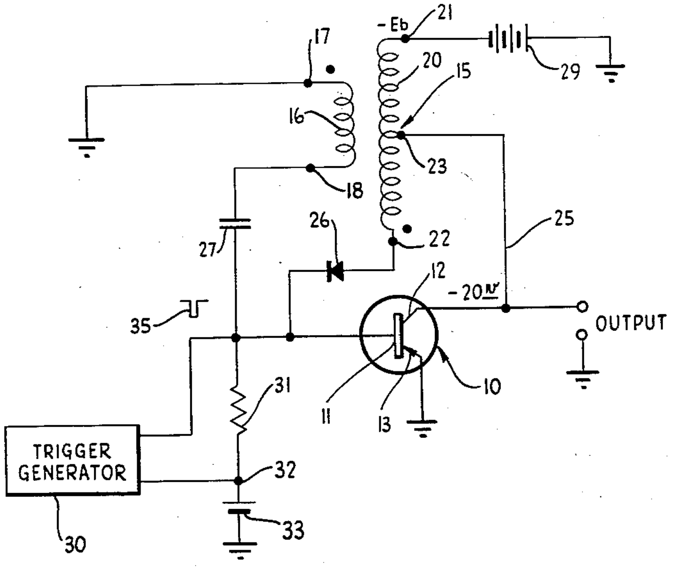

This invention relates to transistor circuits and more particularly to a non-saturating transistor blocking oscillator.

A blocking oscillator is an internally or externally triggered device which generates rectangular voltage pulses. The rise and fall times, amplitude and duration of the pulse are generally important characteristics of the pulse. In order to maintain accurate control of the pulse duration of pulses produced by a transistor blocking oscillator, it is necessary that the transistor be prevented from saturating during the pulse so that minority carrier storage effects do not add appreciable variability to the pulse duration.

A transistor blocking oscillator may assume many different configurations which produce similar results. In one situation where the base and collector of a transistor are coupled, respectively, to primary and secondary windings of a pulse transformer and the emitter is connected to ground, the collector is clamped to a source of bias potential by means of a diode. The amplitude of the bias potential is selected so that the collector voltage remains more negative than the base voltage during the pulse thus preventing saturation of the transistor. Disadvantages of this arrangement are that a separate bias supply is required and that it is necessary that the transistor allow a collector current to flow at the clamp voltage which may result in an undesirable power dissipation limitation.

In an alternative configuration for preventing saturation of a transistor, a silicon diode is placed in the base lead of the transistor and the collector thereof clamped to the low voltage end of the silicon diode by means of a germanium diode. In operation, current in the base lead of the transistor passes through the silicon diode in a forward direction thereby developing a voltage drop of about one volt thereacross during the pulse. In that the collector is clamped to the low voltage end of the silicon diode by means of a germanium diode during the pulse, the transistor is prevented from saturating if the difference in voltage drops between the silicon and germanium diodes is greater than the saturation voltage of the transistor. A disadvantage of this arrangement for preventing saturation of the transistor is that the presence of a silicon diode in the base lead of the transistor may detrimentally affect the rise and fall times of the pulses generated and the triggering characteristics of the device. It would be necessary to employ additional components to compensate for the aforementioned adverse effects. Also, it is possible that the currents conducted by the transistor and germanium diode may be sufficiently large in some applications as to not satisfy the voltage relationships necessary to prevent saturation of the transistor.

It is therefore an object of the present invention to provide a non-saturating transistor blocking oscillator which has none of the disadvantages and limitations of the aforementioned prior art devices.

Another object of the present invention is to provide a transistor blocking oscillator wherein the transistor is not required to conduct excessive pulse currents.

Still another object of the present invention is to provide a transistor blocking oscillator wherein the transistor is prevented from saturating without adversely affecting the rise and fall times of the pulses generated or the triggering characteristics of the device.

A further object of the present invention is to provide a non-saturating transistor blocking oscillator which employs fewer components than comparable present day circuits incorporating this feature.

Figure 2:
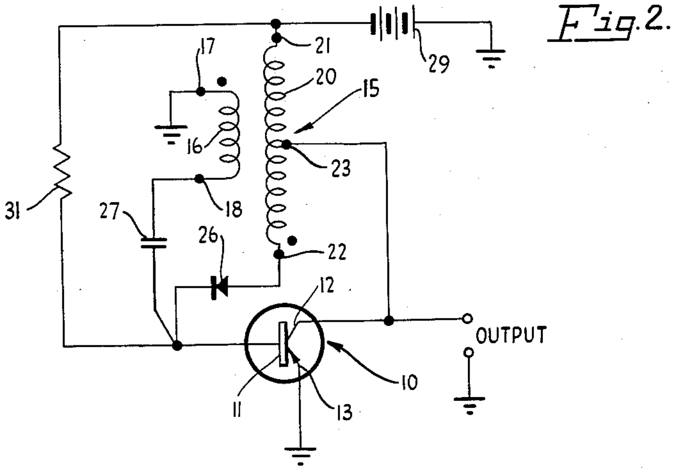

The above-mentioned and other features and objects of this invention and the manner of obtaining them will become more apparent by reference to the following description taken in conjunction with the accompanying drawing, wherein:

Fig. 1 illustrates a schematic diagram of a synchronized transistor blocking oscillator device in accordance with the invention; and Fig. 2 illustrates a schematic diagram of the transistor blocking oscillator of Fig. 1 adapted to be free-running.

Referring now to Fig. 1 of the drawing, a preferred embodiment of the apparatus of the present invention comprises a transistor 10 which has a base 11, a collector 12 which may be connected to an output terminal, and an emitter 13, the emitter 13 being connected to ground. The transistor may be, for example, of a type designated commercially as 2N396. Secondly, the apparatus of the present invention includes a pulse transformer 15, including a primary winding 16 having input terminals 17, 18, the terminal 17 of which is connected to ground, and a secondary winding 20 having output terminals 21, 22 and a tap 23 which is connected to a turn which is approximately 10% of the distance from the terminal 22 to terminal 21, as shown in the drawing, dependent upon the total amplitude of the pulse generated across the secondary winding 20, as will be hereinafter explained. The overall turns ratio of the primary winding 16 to the secondary winding 20 is approximately 1:3. Also, the windings 16, 20 are poled so that when a more positive voltage appears at terminal 17 of primary winding 16, a voltage is induced in the secondary winding 20 which is more positive at the terminal 22 relative to the voltage appearing at terminal 21.

In the present case, the pulse transformer 15 is coupled to the transistor 10 by means of a direct connection 25 from the tap 23 of secondary winding 20 to the collector 12 of transistor 10; a diode 26 connected from terminal 22 of secondary winding 20 to the base 11 of transistor 10 and poled so as to allow current to flow from the terminal 22 to the base 10; and a capacitor 27 connected from the terminal 18 of primary winding 16 to the base 11. A negative bias, $-E_b$, is applied to the collector 12 of transistor 10 by a connection from negative terminal of a source of potential such as, for example, a battery 29, to the terminal 21 of secondary winding 20, the positive terminal of battery 29 being referenced to ground. The negative bias, $-E_b$, may be of the order of 20 volts and is approximately equal to the amplitude of the pulses desired to be generated. Lastly, a trigger generator 30 is connected across an input load resistor 31 which, in turn, is connected from the base 11 of transistor 10 to an input terminal 32. A bias voltage of the order of +5 volts relative to ground is applied to base 11 of transistor 10 by means of a connection from terminal 32 to the positive terminal of a battery 33, the negative terminal of which is referenced to ground.

Thus, under quiescent conditions, a bias voltage of +5 volts relative to ground is applied to the base 11 of transistor 10, a bias of −20 volts relative to ground is applied to the collector 12, and the emitter 13 is maintained at ground potential. Under these quiescent conditions, it is apparent that only leakage current flows through the transistor 10. In order for other than leakage current to flow, it is necessary that the potential of the base 11 be made negative relative to the potential of the emitter 13, which is at ground potential, and the potential of the collector 12 remain negative relative to ground. In operation, a negative pulse 35 having an amplitude of the order of 6 volts is developed across the input load resistor 31 by the trigger generator 30. The amplitude of the pulse 35 is such as to carry the base 11 of transistor 10 negative relative to the potential of the emitter 13 thereby allowing current to flow through the transistor 10. In addition, the negative pulse 35 is applied through the capacitor 27 to the primary winding 16 thereby to develop a pulse thereacross which is 6 volts negative at the terminal 18 relative to the potential at terminal 17, which terminal 17 is connected to ground. Because of the aforementioned polarity of the windings 16, 20, a corresponding pulse is induced in the winding 20 which causes the terminal 22 thereof to go sharply positive.

Simultaneously with the above, current commences to flow from the emitter 13 to the collector 12 of transistor 10, through the lead 25 and through the winding 20 from the tap 23 to the output terminal 21 and thence to the battery 29. The over-all voltage drop across the transistor 10 is approximately one volt whereby the potential level of tap 23 of winding 20 is maintained at a potential level of −1 volt relative to ground. Since the windings 16, 20 have mutual flux linkages, a pulse is generated along the entire length of secondary winding 20. Since 10% of the turns of secondary winding 20 appear between tap 23 and output terminal 22, a voltage equal to 10% of the pulse amplitude will be generated therebetween. Also, in view of the manner in which the winding is poled, the potential of terminal 22 will be positive relative to the potential of tap 23. Thus, in operation, if a pulse having a potential of the order of 20 volts is induced across the entire winding 20, the terminal 22 will be of the order of 10% times 20 volts or 2 volts positive relative to the potential of tap 23, which tap 23 is maintained at a potential of −1 volt relative to ground by means of current flow through the transistor 10. Thus, the terminal 22 of winding 20 is maintained at a potential of the order of +1 volt positive relative to ground during the generation of a pulse. Since the diode 26 is connected from the terminal 22 of winding 20 to the base 11, and poled so as to allow current to flow from the winding 20 to the base 11, it is apparent that current will flow through the diode 26 when the terminal 22 becomes slightly positive relative to the potential of base 11. This flow of current from terminal 22 to the base 11 of transistor 10 diverts some of the current flowing into tap 23 of winding 20 which would otherwise flow to the battery 29. This current flowing back to the base 11 through the diode 26 flows through the winding 20 in a direction that is opposite to the current flowing to the battery 29 and, hence, decreases the mutual flux linkages and hence the amplitude of the pulse generated. In addition, and more important, however, the current flow through the diode 26 maintains the potential of the base 11 positive relative to the potential of collector 12 during generation of the pulse thus preventing saturation of transistor 10 together with its detrimental effects.

Referring to Fig. 2, there is shown the transistor blocking oscillator of Fig. 1 which is adapted to be free-running. In particular, the trigger generator 30 has been deleted and the terminal 32 is connected to a source of negative potential which may, for convenience, be the negative terminal of battery 29. In operation, the transistor 10 commences to conduct when the potential of base 11 becomes negative with respect to the potential of emitter 13 of transistor 10. As current commences to flow through the winding 20 to and through the transistor 10, a negative pulse is induced in winding 16 at terminal 18 relative to terminal 17. This negative pulse is applied through capacitor 27 to the base 11 of transistor 10 whereby the capacitor 27 is charged in the positive direction through transistor 10, lead 25 and diode 26. At the termination of the pulse which is determined by the magnetic characteristics of the core of transformer 15, the charge on the capacitor 27 is released thereby to drive the base 11 of transistor 10 sharply positive thus cutting off the flow of current therethrough. The pulse-repetition-rate is controlled by the amplitude of the negative potential and the time constant of the resistor 31 in conjunction with the capacitor 27, either of which can be made adjustable, if desired.

Although the invention has been shown in connection with a certain specific embodiment, it will be readily apparent to those skilled in the art that various changes in form and arrangement of parts may be made to suit requirements without departing from the spirit and scope of the invention.

What is claimed is:

1. A transistor device for generating pulses of electrical energy comprising a pulse transformer having first and second windings with first and second extremities, respectively, and an intermediate tap on said second winding, said windings being poled in opposite directions relative to said first and second extremities thereof and said first extremity of said first winding being connected to a terminal maintained at a substantially fixed reference potential; a transistor having a base, a collector and an emitter, said emitter being connected to said terminal maintained at said substantially fixed reference potential and said collector being connected to said intermediate tap on said second winding; a capacitor connected from said second extremity of said first winding to said base of said transistor; a source of negative bias potential connected to said first extremity of said second winding for applying a negative bias to said collector of said transistor; and a diode connected from said second extremity of said second winding to said base of said transistor, said diode being poled to allow current to flow from said second winding to said transistor during the generation of pulses thereby to maintain the potential of said base positive relative to the potential of said collector during the generation of said pulses.

2. The transistor device for generating pulses of electrical energy as defined in claim 1 which additionally includes means coupled to said base of said transistor for normally maintaining said base at a potential level that is positive relative to said substantially fixed reference potential and for pulsing the potential of said base to a potential that is negative relative to said substantially fixed reference potential thereby to commence the generation of a pulse of electrical energy.

3. The transistor device for generating pulses of electrical energy as defined in claim 1 which additionally includes a resistor connected from said base of said transistor to said source of negative bias potential whereby said device generates pulses of electrical energy at periodic intervals of time determined by the time constant of said resistor and said capacitor.

4. A transistor pulse generating apparatus comprising a pulse transformer having first and second windings with first and second extremities, respectively, and an intermediate tap on said second winding, said windings being poled in opposite directions relative to said first and second extremities thereof and said first extremity of said first winding being connected to ground; a transistor having a base, a collector and an emitter, said emitter being connected to ground, and said collector being connected to said intermediate tap on said second winding and to an output terminal; a capacitor connected from said second extremity of said first winding to said base of said transistor; a source of negative bias potential connected to said first extremity of said second winding for applying a negative bias to said collector of said transistor; a source of positive bias potential connected through a load resistor to said base; means coupled to said load resistor for developing pulses thereacross that are negative relative to ground at said base thereby to synchronize the generation of pulses; and a diode connected from said second extremity of said second winding to said base of said transistor, said diode being poled to allow current to flow from said second winding to said transistor during the generation of said pulses and the amplitude of the portion of voltage pulse generated across said secondary winding from said intermediate tap to said second tap being greater than the voltage drop across said diode thereby to maintain said base positive relative to the potential of said collector during the generation of said pulses and thereby prevent said transistor from saturating.

No references cited.